United States Patent [19]
Taylor

[11] Patent Number: 5,552,656
[45] Date of Patent: Sep. 3, 1996

[54] SELF-POWERED ANTI-FOULING DEVICE FOR WATERCRAFT

[75] Inventor: George W. Taylor, Mercer County, N.J.

[73] Assignee: Ocean Power Technologies, Inc., West Trenton, N.J.

[21] Appl. No.: 511,762

[22] Filed: Aug. 7, 1995

[51] Int. Cl.⁶ .......................... H01L 41/09; H01L 41/113
[52] U.S. Cl. .......................... 310/337; 310/317; 310/319; 310/339
[58] Field of Search ..................... 310/337, 339, 310/317, 319, 371; 60/499, 501; 290/53

[56] References Cited

U.S. PATENT DOCUMENTS

| | | | |
|---|---|---|---|
| 3,064,137 | 11/1962 | Corbett et al. | 290/53 |
| 3,239,678 | 3/1966 | Kolm et al. | 310/339 |
| 3,842,770 | 10/1974 | Hedbawny et al. | 114/20 B |
| 4,170,185 | 10/1979 | Murphy et al. | 310/337 |
| 4,185,621 | 1/1980 | Morrow | 128/672 |
| 4,283,461 | 8/1981 | Wooden et al. | 428/422 |
| 4,297,394 | 10/1981 | Wooden et al. | 427/100 |
| 4,939,407 | 7/1990 | Goo et al. | 310/366 |
| 5,386,397 | 1/1995 | Urroz | 367/139 |
| 5,420,825 | 5/1995 | Fischer et al. | 367/1 |

OTHER PUBLICATIONS

Latour, M. et al, "Application of $PVF_2$ Transducers as Piezoelectric Vibraters for Marine Fouling Prevention", Ferroelectrics, 1981 vol. 32, pp. 33–37.

*Primary Examiner*—Thomas M. Dougherty
*Attorney, Agent, or Firm*—Henry I. Schanzer; Michael Y. Epstein

[57] ABSTRACT

An anti-fouling device comprises a layer of piezoelectric material, preferably a poled plastic material such as a PVDF polymer, for mounting on the hull of a watercraft. The layer has electrodes on opposite major surfaces thereof, and the layers are connected to a power supply comprising a battery and a d.c. to a.c. converter. The converter generates an a.c. voltage at a frequency, e.g., 20 KHz, for causing vibrations of the layer, such vibrations serving to retard the growth of water dwelling organisms in the craft. The layer electrodes are also connected to an a.c. to d.c. converter for converting a.c. energy to d.c. energy suitable for trickle charging the power supply battery. Accordingly, during transit of the craft through the water, water induced hull vibrations cause vibrations of the layer for generating a.c. energy for storage in the battery, which stored energy is used for causing anti-fouling vibrations of the energy generating layer.

3 Claims, 4 Drawing Sheets

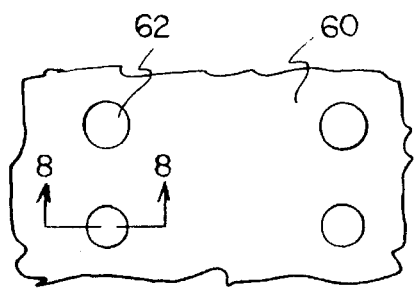
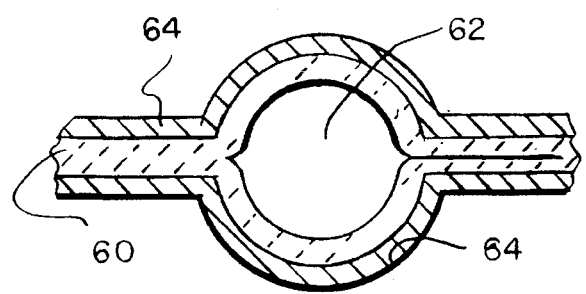
FIG. 7  FIG. 8
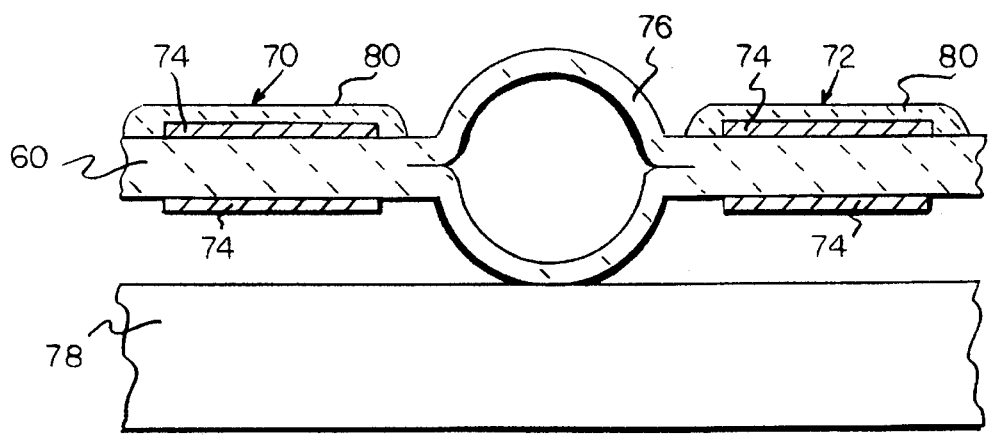
FIG. 9

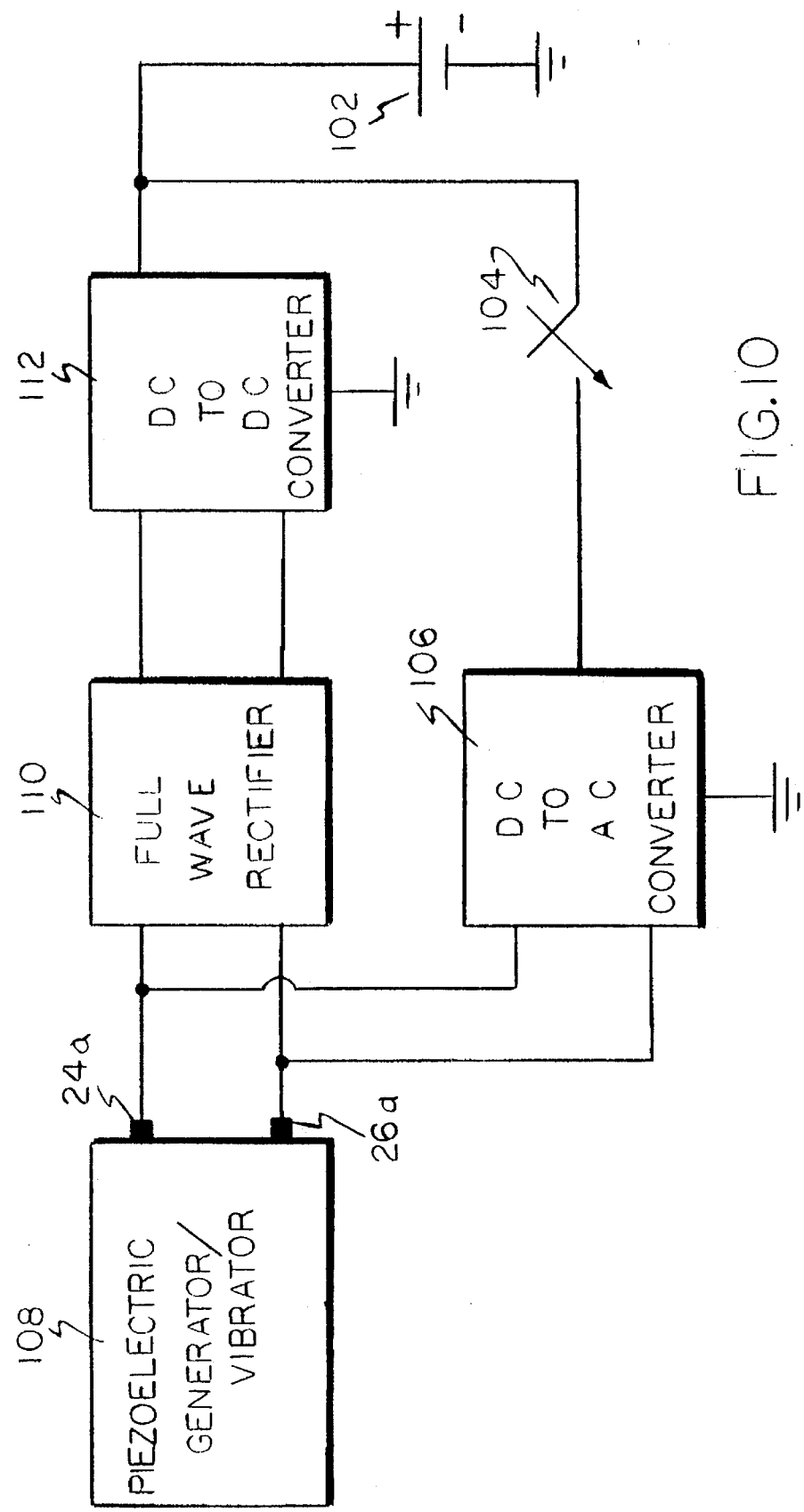

SELF-POWERED ANTI-FOULING DEVICE FOR WATERCRAFT

BACKGROUND OF THE INVENTION

This invention relates to anti-fouling devices for watercraft, and particularly, to a self-powered anti-fouling device. It is known that watercraft can be protected against fouling, that is, the growth thereon of water dwelling organisms, by causing the craft hull to vibrate continuously at some audio frequency, e.g., 20 KHz. One means to accomplish this is disclosed by Latour and Murphy, "Application of $PVF_2$ Transducers As Piezoelectric Vibrators for Marine Fouling Prevention", Ferroelectrics, 1981, Vol. 32, Pages 33–37. Their article comprises disposing an electroded thin layer of a piezoelectric plastic material on a boat hull at and below the water line and applying an a.c. voltage at the desired frequency between the layer electrodes. Applying a voltage across a piezoelectric material causes a deformation or straining of the material, and applying an a.c. voltage across the material causes it to vibrate at the frequency of the applied voltage.

The piezoelectric plastic layer can be bonded to or embedded within the hull of a watercraft and, once in place, can be used indefinitely. A problem, however, particularly with small watercraft, is the need to provide electrical power for driving the piezoelectric vibrator. On small craft, even small engines for trickle charging a battery are generally undesirable, hence a need exists for an arrangement, particularly suitable for use in small watercraft, for trickle charging a battery used for supplying energy to the piezoelectric vibrator.

SUMMARY OF THE INVENTION

An anti-fouling device comprises an electroded layer of a piezoelectric material for mounting on the hull of a watercraft for providing anti-fouling protection for the craft. A power supply of known type, comprising a battery and a direct current (d.c.) to alternating current (a.c.) converter, is mounted on the craft for applying an a.c. signal of appropriate frequency to the electrodes of the layer for causing it to vibrate at an anti-fouling frequency. Also mounted on the craft is an a.c. to d.c. converter for converting a.c. energy to a d.c. voltage suitable for trickle charging the battery used in the aforementioned power supply. The electrodes of the piezoelectric layer are also connected to the a.c. to d.c. converter and a.c. energy generated by the piezoelectric layer in response to normal hull vibrations, e.g., caused by bouncing motion of the craft against the water, is converted to d.c. energy for trickle charging the power supply battery. Thus, the very same piezoelectric layer which consumes energy during use of the layer as an anti-fouling means serves as a means for supplying the consumed energy.

DESCRIPTION OF THE DRAWING

FIG. 7 is a plan view of a segment of an electroded piezoelectric material sheet having protruding bubbles;

FIG. 8 is a cross-section on an enlarged scale, of one of the bubbles shown in FIG. 7;

FIG. 9 is a view similar to FIG. 8, but on an even larger scale, showing the mounting of a bubbled sheet on a hull; and FIG. 10 is a block diagram of a system for converting energy stored in a battery to an AC signal for driving a piezoelectric element and for converting AC energy produced by the piezoelectric element into a DC signal in accordance with the invention.

DESCRIPTION OF PREFERRED EMBODIMENTS OF THE INVENTION

Figure 1:
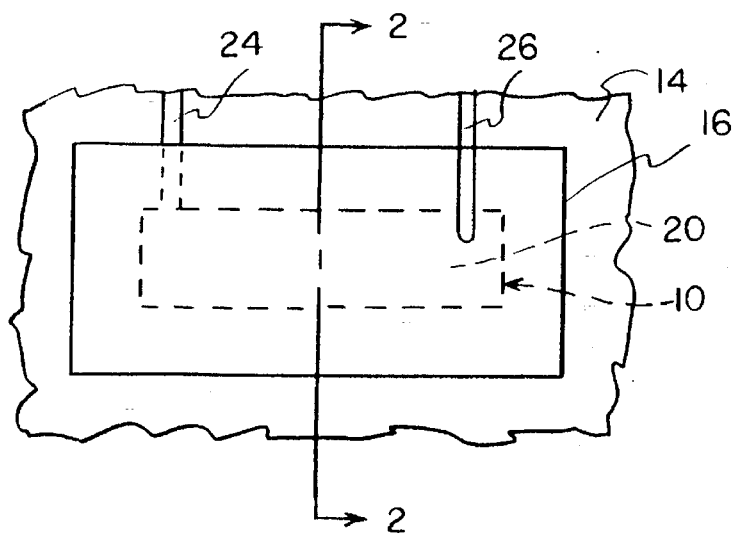
FIG. 1 is a side elevation of a portion of a hull having a piezoelectric generator mounted thereon.

The use of piezoelectric material for generating electrical energy is known. U.S. Pat. Nos. 4,404,490, Sep. 13, 1983 (Burns et.al.) and 4,685,296, Aug. 11, 1987 (Burns), for example, show the use of piezoelectric generators for converting the mechanical energy of ocean waves to electrical energy. In my copending patent application, Ser. No. 08/511, 761, entitled "Water Craft Using Piezoelectric Materials", filed Aug. 7, 1995, on behalf of myself and M. Y. Epstein, there are disclosed various arrangements for disposing piezoelectric power generating elements on and in the hulls of water craft for generating electricity in response to vibrations of the elements caused by water impact against the craft hull. The subject matter of the US patents and my application are incorporated herein by reference.

In accordance with the present invention, the same piezoelectric power generator used for generating electrical energy for storage in a battery is driven by the stored electrical energy for vibrating in a mode suitable for providing anti-fouling protection.

A description of piezoelectric power generators suitable for use in the present invention is now described.

Materials having piezoelectric properties are well known and comprise materials which, in response to mechanically induced strains (i.e., dimensional variations), generate electrical charges throughout the volume of the strained material in proportion to the mechanical energy used to strain the material. By providing electrodes on spaced apart surfaces of the material, the electrical charges can be collected for generating electrical energy. By alternately straining and de-straining the material, A.C. electrical energy is generated.

Numerous piezoelectric materials are known, but certain piezoelectric materials are particularly well suited for use with the invention. Such materials comprise certain polymers which can be cast in the form of large but thin plastic sheets. Particularly, polymers known as PVDF polymers can be used. PVDF stands for poly vinylidene fluoride. By "PVDF polymer" is meant either the PVDF polymer by itself or various copolymers comprising PVDF and other polymers, e.g., a copolymer referred to as P(VDF-TrFE) and comprising PVDF and PTrFE (poly trifluoroethylene).

Such PVDF polymers are known, commercially available materials having various commercial applications, e.g., as dielectric materials for capacitors. Although these materials, as commonly used, are simple dielectrics having no piezoelectric properties, such properties can be provided when the materials are properly "poled." By "poled" is meant that electric dipoles in the materials, which dipoles are normally randomly oriented, are identically oriented within the materials. This is accomplished by heating the materials, to enhance the mobility of the dipoles, and applying a relatively large voltage across the materials to cause all the dipoles to identically align themselves along the electrostatic field lines provided by the D.C. voltage. Then, the materials are cooled and, when the dipole mobility is low, the voltage is removed for permanently "freezing" in place the aligned dipoles.

An important advantage of such PVDF polymers in connection with the present invention is that they can be applied in a number of different ways to the hulls of water crafts.

For example, the P(VDF-TrFE) copolymer can be prepared as a fluid and applied to a surface by a "spin-on process", or by painting, spraying, or the like, all of which processes are known. After drying, the resulting sheet can be poled as above described. The PVDF monopolymer can also be applied as a fluid, but the poling process of such polymer also requires stretching of the film while it is being poled, which, of course, can present problems when the material is applied to an existing hull surface.

Additionally, both the aforementioned PVDF polymers are commercially available as large, thin sheets including thin electrodes of various metals, e.g., silver, aluminum, copper and tin, as well as known conductive inks, on opposite major surfaces thereof. The sheets are relatively strong and tear resistant, flexible and chemically inert and such PVDF polymer piezoelectric materials are ideal for being applied to the hulls of vessels for forming either the inner or outer surfaces of the hulls or being laminated within the hulls. When flexibility is particularly important, as generally so in connection with the present invention, the metal electrodes (if used, see hereinafter) can be of metals having high ductility, e.g., tin and silver, and, preferably, of a known conductive ink including, for example, carbon black or silver particles.

The invention has particular utility in connection with hulls made of fiberglass. Typically, such fiberglass hulls are made by applying successive layers of fiberglass, e.g., using a spin-on process, painting or spraying, until a desired wall thickness is achieved. As part of such process, in accordance with one embodiment of the invention, a piezoelectric element 10 (FIGS. 1 and 2), particularly an electroded sheet including a poled layer 12 of a PVDF polymer, is applied to a fiberglass wall 14 of a hull prior to the final layer (or layers), and the final layer of fiberglass 16 is applied over the PVDF polymer layer 12 for hermetically and firmly securing it in place.

If the PVDF polymer [preferably the aforementioned P(VDF-TrFE) co-polymer, to avoid the need for stretching during poling] is applied as a fluid and then dried, a thin metallic layer 18, such as tin or a conductive ink, is first applied to the fiberglass wall 14, as by painting or spraying. The polymer layer 12 is applied over the metallic layer 18 and covered, in turn, with a second metallic layer 20. The polymer layer 12 is then poled, as previously described. The final fiberglass layer 16 is applied over the second metallic layer 20 as well as the edges 22 of the polymer layer 12.

As illustrated, the two metallic layers 18 and 20 are electrically contacted by terminals 24 and 26, respectively, which extend through the covering layer 16 and upwardly along the hull outer wall 14. Although not shown, the terminals 24 and 26 are also hermetically encapsulated except for exposed ends for electrical interconnection.

If the PVDF polymer is in the form of an electroded sheet, it can be bonded, e.g., by a known epoxy cement, to the fiberglass wall 14, and the final layer(s) of fiberglass 16 applied thereover. If the fiberglass is applied as a fluid, the contacting fiberglass layer 16 securely bonds to the outer, metal layer 20 of the PVDF polymer sheet. Alternatively, a covering sheet of fiberglass can be directly bonded, e.g., using an epoxy cement, to the PVDF polymer sheet.

In any event, for completely hermetically encapsulating the piezoelectric element 10, the piezoelectric element preferably does not cover the entire surface of the fiberglass wall 14, and the final fiberglass layer 16 overlaps the edges 22 for direct contacting and firm bonding of the covering fiberglass layer to the fiberglass wall 14 underlying the piezoelectric element.

By way of example, the PVDF polymer layer 12 can have a thickness of around 1 mm, and the metallic electrodes 18 and 20 can have a thickness of around 1 μm. As mentioned, PVDF polymer piezoelectric electroded sheets are commercially available. Also, they are available with various thicknesses and various metal electrodes.

In other applications, e.g., in crafts having hulls of wood or metal, the piezoelectric element, preferably in the form of an electroded sheet, is applied directly onto an outer surface of the hull and hermetically encapsulated. Fiberglass is a suitable encapsulating material and adheres well to many materials. Additionally, other known encapsulating materials, e.g., lead paints, can be used to coat and hermetically seal the piezoelectric sheet from the water.

Another suitable protective material is a layer of the same PVDF polymer used in the piezoelectric element. As previously noted, such PVDF polymers are chemically inert and can be immersed in sea water for extended time periods without degradation. A particular advantage of using such a PVDF protective coating is that multilayer PVDF polymer sheets 28 (see FIG. 3) are commercially available with layers 30, 32 of polymer and electrodes 34, 36 and 38 alternating with each other. An advantage of multiple layered piezoelectric structures is that more efficient conversion of mechanical energy to electrical energy is obtainable.

Figure 2:
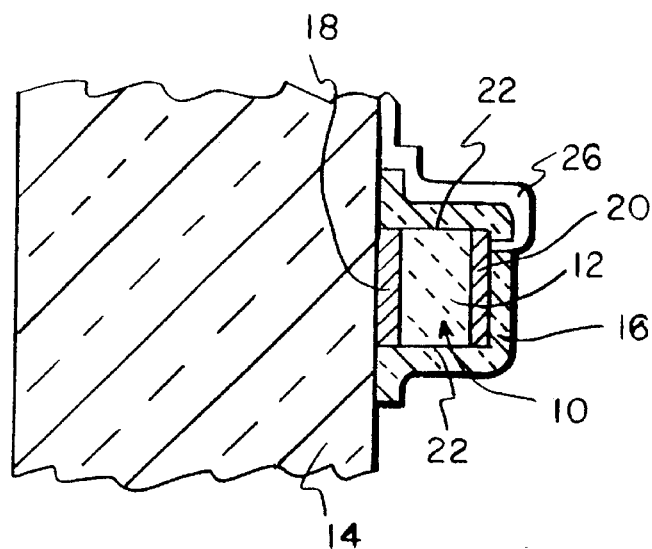
FIG. 2 is a cross section taken through the wall of the hull along line 2—2 of FIG. 1.
Figure 3:
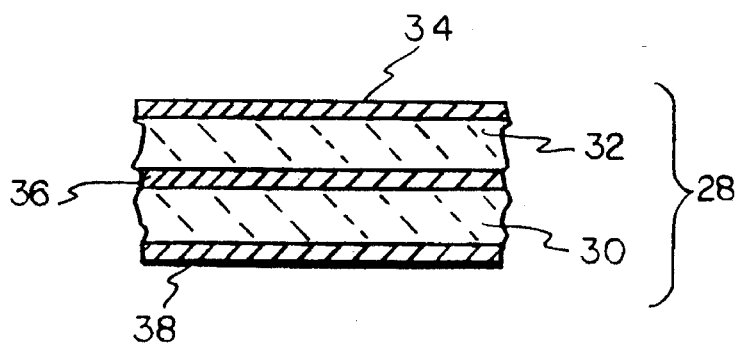
FIG. 3 is a cross-sectional view of a commercially available laminated piezoelectric material sheet.

For use in accordance with this invention, one of the outer electrodes, i.e., electrode 34 of the commercially available laminate sheet 28 shown in FIG. 3 is omitted, and the thus exposed polymer layer 32 of the sheet 28 serves as the outer protective layer 16 of the piezoelectric element 10 shown in FIG. 2.

Figure 4:
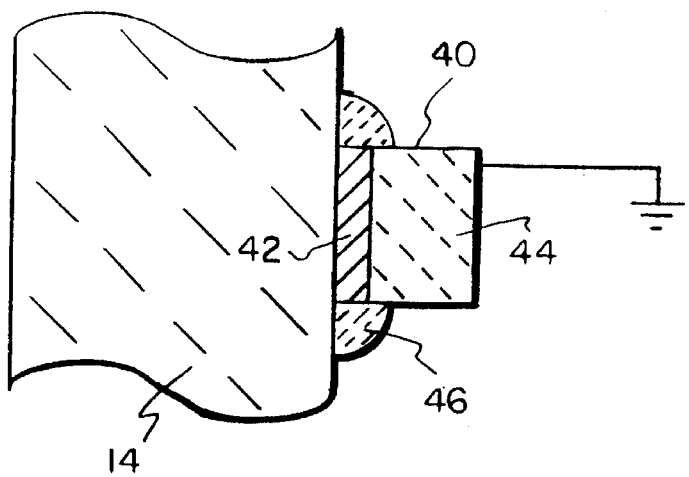
FIGS. 4, 5 and 6 are views similar to FIG. 2 but showing different electrode arrangements for the piezoelectric generator.
Figure 5:
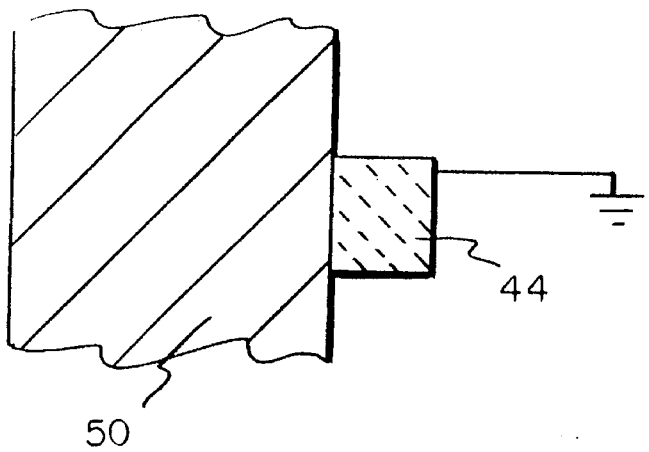

A further advantage of the use of a polymer layer (e.g., layer 32 in FIG. 3) as the outer, hermetically sealing, protective layer, is that, in crafts used in salt water, the salt water itself can comprise an electrode. In such case, as shown in FIG. 4, the piezoelectric element 40 comprises but one (inner) electrode 42 and a polymer layer 44 which serves the dual function of generating electrical energy and hermetically encapsulating the inner electrode 42. Because the surrounding salt water functions as the outer electrode of the piezoelectric element 40, completion of an electric circuit including the piezoelectric element requires the provision of an electrode from the craft extending into the water to form a complete circuit. Also, an encapsulant material is applied as a bead 46 for hermetically encapsulating the peripheral edges of the piezoelectric element.

Where the hull 50 (FIG. 5) is of metal, even the inner metallic electrode shown in FIG. 4 can be omitted.

Figure 6:
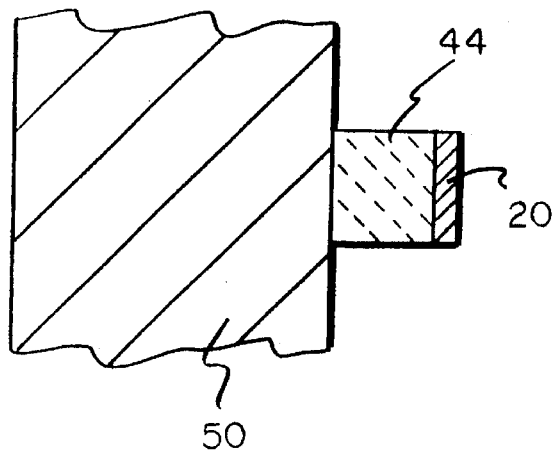

Thus, depending upon the craft hull material and the water in which the craft is used, the piezoelectric element can comprise solely a layer of a piezoelectric material (FIG. 5, metal hull, salt water use), or a piezoelectric material layer in combination only with an inner metallic layer (FIG. 4, non-metallic hull, salt water), or a piezoelectric material layer with an outer metallic layer (FIG. 6, metal hull, fresh water).

In use of the piezoelectric element on a water craft, the two electrodes (however constituted) contacting the opposite surfaces of the piezoelectric material layer are electrically connected to a known type of electrical device for collecting and storing electrical energy generated by the piezoelectric element. As known, piezoelectric elements of the type described generate electrical energy in response to mechanically induced vibrations which cause alternating straining and destraining of the piezoelectric material.

In a water craft, the hull vibrates in response to bouncing contacts of the hull with the water and in response to passing turbulent water, particularly at the stern of the craft. Such mechanical vibrations of the hull are transmitted to a piezoelectric element mounted on or in the hull wall, in accordance with this invention, whereby alternating current electrical energy is generated by the piezoelectric element.

The amount of energy generated is a function of the amplitude of vibrations and the volume of the piezoelectric material being vibrated. The amplitude of the a.c. generated voltage is a function of the thickness of the piezoelectric material sandwiched between the electrodes. The electrical characteristics of various piezoelectric materials are well known.

A suitable electrical device for absorbing and storing the generated electrical energy is a combination of an a.c. to d.c. rectifier and a voltage amplifier for generating a voltage output suitable for trickle charging a d.c. battery. Such devices are known or can be readily designed.

As mentioned, mechanical vibrations are induced by, among other things, turbulent water flow. Normally, and usually preferably, the surface of a water craft hull exposed to the water is quite smooth. This is desirable for streamlining and reduced water drag. However, to the extent that the water flows perfectly smoothly across the hull surface, little water turbulence is produced. It is possible, however, to increase the water turbulence along the hull surface while not significantly altering the streamlining thereof.

An example of this is illustrated in FIGS. 7 and 8 which show a piezoelectric sheet 60 provided with spaced apart, hermetically sealed pockets 62 of air. As such, the sheet 60 is quite similar to commercially available bubbled plastic sheets commonly used as filler in shipping packages. The air pockets (or "bubbles") greatly enhance the compressibility of the sheets for absorbing mechanical energy for protecting packaged products from mechanical damage. Similarly, in piezoelectric elements in accordance with this invention, the greater absorption of mechanical energy provided by the pockets (which preferably contain air, or other compressible substances) is accompanied by a corresponding flexure of the polymer material forming the walls of the pockets. Also, the protruding bubbles 62 in the sheet 60 disrupt the smooth flow of the water past the water craft thereby inducing water turbulence for causing flexing of the sheet. The sizes and spacings of the bubbles can be varied to provide varying degrees of water turbulence and varying amounts of generated electrical energy at given craft speeds. Thus, depending upon how a craft is normally used, a selected tradeoff can be made between greater or lesser turbulence and corresponding lesser or greater streamlining.

While FIG. 8 shows layers of metal overlying a bubble 64, this may be difficult to achieve in manufacture. An alternative arrangement is shown in FIG. 9 where, with a common layer 60 of a plastic-like material, e.g., the aforedescribed PVDF polymers, piezoelectric elements 70 and 72, including metal electrodes 74, are spaced apart by non-electroded, bubbled sections 76 (only one shown) of the layer. For allowing free flexure of the layer 60, the layer 60 is spaced from the underlying supporting hull 78 by the bubbles 76. Also, the outer metal electrodes are covered with an encapsulating material layer 80, e.g., fiberglass on the PVDF polymer itself. Also, in salt water use, the outer metal electrodes can be omitted, as previously described.

The identical electrical generators disclosed for generating electricity are used, in accordance with the invention, for providing anti-fouling protection for the craft. Thus, by applying an a.c. voltage at appropriate frequency, e.g., 20 kHz, to the various pairs of electrodes of the disclosed generator, the piezoelectric layer or layers of the generator (now vibrators) are caused to vibrate at the frequency of the applied voltage.

In general, during normal usage of the water craft in transit through the water, the piezoelectric generators generate electrical energy which is stored, for example, in an on-board battery, as described. Then, during periods when the craft is relatively stationary, as at anchor, and when most susceptible to fouling, energy stored in the battery is switched back to the piezoelectric elements for causing them to vibrate. The direct current (d.c.) energy of the battery must be changed to an appropriate frequency alternating current (a.c.) voltage using known d.c. to a.c. choppers and the like.

Referring to FIG. 10, note that a battery 102 may be coupled via a switch 104 to the input of a d.c. to a.c. converter 106 whose output is connected to the electrodes 24a, 26a, of a piezoelectric generator/vibrator 108 of the type described above. When switch 104 is closed, power is supplied from the battery 102 to converter 106 which may be any one of a number of known DC to AC converters capable of driving the piezoelectric element 108. The converter 108 may be designed (or set) to produce AC signals over a wide range of frequency values (hundreds of cycles to thousands of cycles). In anti-fouling applications, the converter 106 is selected to cause the piezoelectric vibrator 108 to vibrate at a frequency (e.g., 20 KHz) which will reduce, if not eliminate, the fouling of the boat hull. Normally, switch 104 will be closed and the piezoelectric vibrator 108 will be powered to vibrate when the boat is at rest.

When the boat is in motion, the piezoelectric element 108 functions as a generator of electricity, and switch 104 is normally open. The stress and strain of the piezoelectric element 108 resulting from the motion of the boat produces an a.c. voltage at electrodes 24a, 26a. The a.c. voltage produced by the generator 108 at terminals 24a and 26a is applied to a full wave rectifier 110 whose output is applied to a d.c. to d.c. converter 112 whose output, in turn, is coupled to battery 102 to charge or recharge the battery. The full wave rectifier may be a bridge circuit comprising four diodes and include a capacitor for smoothing the rectified voltage. The DC to DC converter may be a switching regulator or any other suitable type of DC to DC converter for producing a voltage suitable to charge or recharge battery 102 to a desired level.

What is claimed is:

1. A system including an electroded layer of piezoelectric material mounted in a position to be stressed and strained and to then produce an alternating current (a.c.) voltage, said piezoelectric material being coupled to voltage rectifying means for converting the a.c. energy produced by the piezoelectric material when stressed and strained into direct current (d.c.) energy for charging a battery; and a direct current to alternating current converter means coupled between the battery and the said piezoelectric material for converting the direct current energy stored in the battery into an alternating current signal having a preselected frequency and applying the a.c. signal to the piezoelectric material for causing the piezoelectric material to vibrate at a rate proportional to said preselected frequency.

2. The system as claimed in claim 1 wherein said electroded layer of piezoelectric material is mounted on a water contacting portion of the hull of a water craft for anti-fouling of the boat surface.

3. A self-powered anti-fouling device for use with a water craft comprising an electroded layer of piezoelectric material for being mounted on a water contacting portion of the hull of a water craft; rectifying means for converting a.c. energy generated by said piezoelectric material, in response to vibration transferred thereto by the hull of the craft, into d.c. energy for trickle charging a battery, and means for converting d.c. stored in said battery to a.c. energy at a preselected frequency for causing vibration of said layer at said preselected frequency.

* * * * *